United States Patent
Takanashi

(10) Patent No.: US 9,303,164 B2
(45) Date of Patent: Apr. 5, 2016

(54) METHOD OF PREPARING A CURABLE POLYORGANOSILOXANE COMPOSITION

(71) Applicant: MOMENTIVE PERFORMANCE MATERIALS JAPAN LLC, Tokyo (JP)

(72) Inventor: Masanori Takanashi, Tokyo (JP)

(73) Assignee: MOMENTIVE PERFORMANCE MATERIALS JAPAN LLC, Tokyo (JP)

( * ) Notice: Subject to any disclaimer, the term of this patent is extended or adjusted under 35 U.S.C. 154(b) by 0 days.

(21) Appl. No.: 14/524,036

(22) Filed: Oct. 27, 2014

(65) Prior Publication Data

US 2015/0045487 A1   Feb. 12, 2015

Related U.S. Application Data

(62) Division of application No. 13/699,433, filed as application No. PCT/JP2011/073375 on Oct. 12, 2011, now abandoned.

(30) Foreign Application Priority Data

Oct. 14, 2010 (JP) .................... 2010-231383

(51) Int. Cl.
| | |
|---|---|
| C08G 77/12 | (2006.01) |
| C08L 83/04 | (2006.01) |
| H01L 23/29 | (2006.01) |
| C09J 183/04 | (2006.01) |
| B05D 3/02 | (2006.01) |
| C09D 183/04 | (2006.01) |
| C08G 77/20 | (2006.01) |
| C08G 77/00 | (2006.01) |

(52) U.S. Cl.
CPC ............... *C08L 83/04* (2013.01); *B05D 3/0254* (2013.01); *C09D 183/04* (2013.01); *C09J 183/04* (2013.01); *H01L 23/295* (2013.01); *H01L 23/296* (2013.01); *C08G 77/12* (2013.01); *C08G 77/20* (2013.01); *C08G 77/70* (2013.01); *C08L 2203/206* (2013.01); *C08L 2205/025* (2013.01); *C08L 2314/08* (2013.01); *H01L 2924/0002* (2013.01)

(58) Field of Classification Search
CPC ......... C08L 83/04; C08L 83/00; C08G 77/12; C08G 77/20; C08K 3/36; B01J 23/40; H01L 23/29
USPC ...................................... 528/31, 32
See application file for complete search history.

(56) References Cited

U.S. PATENT DOCUMENTS

| 8,129,480 | B2 | 3/2012 | Takanashi et al. | |
| 2005/0006794 | A1 | 1/2005 | Kashiwagi et al. | |
| 2006/0270792 | A1* | 11/2006 | Kashiwagi | 524/862 |
| 2007/0166470 | A1 | 7/2007 | Kashiwagi | |
| 2009/0236759 | A1 | 9/2009 | Kashiwagi | |
| 2009/0281243 | A1 | 11/2009 | Takanashi et al. | |
| 2010/0099790 | A1* | 4/2010 | Manabe et al. | 522/172 |

FOREIGN PATENT DOCUMENTS

| EP | 1094091 | * | 4/2001 |
| JP | 7-53872 | A | 2/1995 |
| JP | 2000-169714 | A | 6/2000 |
| JP | 2001-2922 | A | 1/2001 |
| JP | 2005-42099 | A | 2/2005 |
| JP | 2007-2234 | A | 1/2007 |
| JP | 2007-191504 | A | 8/2007 |
| JP | 2009-21534 | A | 9/2009 |
| JP | 2009-236265 | A | 10/2009 |
| JP | 2009-256603 | A | 11/2009 |
| JP | 2010-47646 | A | 3/2010 |
| WO | WO 2008/047892 | A1 | 4/2008 |

OTHER PUBLICATIONS

International Search Report for PCT/JP2011/073375 dated Dec. 6, 2011.
European Search Report which issued on Oct. 18, 2013 for corresponding European application 11832540.6-1301.
English-language International Preliminary Report on Patentability and Written Opinion of the International Searching Authority, dated May 16, 2013 for International Application PCT/JP2011/073375 filed Oct. 12, 2011; Applicants: Momentive Performance Materials Japan LLC et al.
Freeman, Silicones, Published for the Plastics Institute, ILIFFE Books, Ltd., 1962, p. 27.

* cited by examiner

*Primary Examiner* — Kuo-Liang Peng
(74) *Attorney, Agent, or Firm* — Holtz, Holtz & Volek PC

(57) ABSTRACT

A method of preparing a curable polyorganosiloxane composition including kneading a uniform mixture of an alkenyl group-containing polyorganosiloxane, a polyorganohydrogensiloxane, and a platinum group metal compound, and defoaming the kneaded mixture under reduced pressure, the alkenyl group-containing polyorganosiloxane includes a linear polyorganosiloxane of the formula (I):

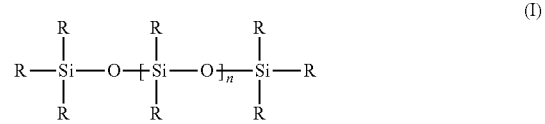

R is $R^1$ or $R^2$, and at least two Rs are $R^1$; $R^1$ is $C_2$-$C_6$ alkenyl; $R^2$ is $C_1$-$C_6$ alkyl; and n is a value that yields a viscosity at 23° C. of 10 to 10,000 cPs, a branched polyorganosiloxane containing $SiO_{4/2}$ and $R'_3SiO_{1/2}$ units, optionally a $R'_2SiO$ and/or a $R'SiO_{3/2}$, R' represents a monovalent aliphatic or alicyclic, and at least three R' groups per molecule are alkenyls, the alkenyl group-containing polyorganosiloxane having a weight ratio of the branched to linear polyorganosiloxane of 1 to 5; and a number of hydrogens bonded to a silicon atom of the polyorganohydrogensiloxane exceeds 2.

11 Claims, No Drawings

METHOD OF PREPARING A CURABLE POLYORGANOSILOXANE COMPOSITION

CROSS-REFERENCE TO RELATED APPLICATIONS

This application is a divisional application of application Ser. No. 13/699,433 filed on Nov. 21, 2012 (abandoned), which is a United States national phase application of PCT/JP2011/073375 filed on Oct. 12, 2011. The entire contents of application Ser. No. 13/699,433 and International application PCT/JP2011/073375 are incorporated herein by reference.

TECHNICAL FIELD

The present invention relates to a curable polyorganosiloxane composition which cues by an addition reaction.

BACKGROUND ART

A curable polyorganosiloxane composition which cures by an addition reaction has been known to provide a rubbery cured product excellent in heat resistance, weather resistance, electric insulation, and has been widely used in various fields. Among these, it has been attracted attention in the fields of automobile and semiconductor fields, and in these fields, extremely strict reliability has been required for the purpose of uses thereof, and as one of the requirements, there is required to have cold resistance which can endure the use at a cold district or low-temperature environment.

It has been known to introduce a phenyl group into a base polymer to improve cold resistance (Patent Literature 1). It has also been known to formulate an organopolysiloxane having a resinous structure (Patent Literature 2).

PRIOR ART LITERATURES

Patent Literatures

[Patent Literature 1] JP 2000-169714A
[Patent Literature 2] JP 2001-2922A

DISCLOSURE OF THE INVENTION

Problems to be Solved by the Invention

However, a base polymer in which a phenyl group is introduced into the base polymer or an organopolysiloxane having a resinous structure has a relatively higher viscosity compared with the polymerization degree thereof, whereby they are inferior in workability, in particular, a cured product of the base polymer containing a phenyl group with a large amount involves the problem that its modulus of elasticity is markedly dependent on the temperature.

An object of the present invention is to provide a curable polyorganosiloxane composition which provides a cured product excellent in cold resistance. Incidentally, the cold resistance can be evaluated by comparing shear modulus of the cured product at low temperature ($-100$ to $-50°$ C.) and at room temperature (0 to $40°$ C.). In general, the cured product of the polyorganosiloxane composition has a melting point at around $-40°$ C., and its shear modulus markedly changes at the melting point as a boundary in many cases.

Means to Solve the Problems

The present inventor has intensively studied to solve the above-mentioned problems, and found that by utilizing compatibility of a specific linear polyorganosiloxane and a branched polyorganosiloxane, and using the branched polyorganosiloxane with a large amount as a base polymer, abrupt change in modulus of elasticity of the cured product can be controlled at the low temperature and the room temperature, and cold resistance can be improved, to accomplish the present invention.

That is, the present invention relates to a curable polyorganosiloxane composition comprising
(A) an alkenyl group-containing polyorganosiloxane which comprises
(A1) a linear polyorganosiloxane represented by the formula (I):
[Formula 1]

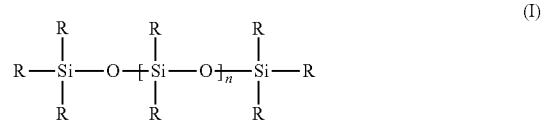

(wherein
Rs independently represent $R^1$ or $R^2$, and among Rs, at least two of which are $R^1$s,
$R^1$s independently represent a $C_2$-$C_6$ alkenyl group,
$R^2$s independently represent a $C_1$-$C_6$ alkyl group, and
n is a number which makes a viscosity at $23°$ C. 10 to 10,000 cP), and
(A2) a branched polyorganosiloxane comprising a $SiO_{4/2}$ unit and a $R'_3SiO_{1/2}$ unit, and optionally a $R'_2SiO$ unit and/or a $R'SiO_{3/2}$ unit (wherein R's each independently represent, an unsubstituted or substituted, monovalent aliphatic group or alicyclic group), and at least three of R's being alkenyl groups per one molecule,
a weight ratio of (A2) based on (A1) being 1 to 5, and
a weight ratio of the $SiO_{4/2}$ unit and the optionally existing $R'SiO_{3/2}$ unit being 20 to 60% by weight based on the total weight of (A1) and (A2);
(B) a polyorganohydrogensiloxane having hydrogen atoms bonded to a silicon atom in a number of exceeding 2 in the molecule; and
(C) a platinum group metal compound.

Also, the present invention relates to an adhesive containing the above-mentioned curable polyorganosiloxane composition, and a semiconductor device encapsulated by using the above-mentioned curable polyorganosiloxane composition.

Effects of the Invention

According to the present invention, a curable polyorganosiloxane composition which provides a cured product excellent in cold resistance can be obtained.

BEST MODE TO CARRY OUT THE INVENTION (A) Alkenyl Group-Containing Polyorganosiloxane The polyorganosiloxane composition of the present invention contains (A) an alkenyl group-containing polyorganosiloxane which comprises (A1) a linear polyorganosiloxane represented by the formula (I):

[Formula 2]

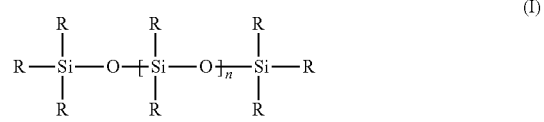

(wherein
Rs independently represent $R^1$ or $R^2$, and among Rs, at least two of which are $R^1$s,
$R^1$s independently represent a $C_2$-$C_6$ alkenyl group,
$R^2$s independently represent a $C_1$-$C_6$ alkyl group,
n is a number which makes a viscosity at 23° C. 10 to 10,000 cP), and (A2) a branched polyorganosiloxane comprising a $SiO_{4/2}$ unit and a $R'_3SiO_{1/2}$ unit, and optionally a $R'_2SiO$ unit and/or a $R'SiO_{3/2}$ unit (wherein R's each independently represent, a monovalent unsubstituted or substituted hydrocarbon group), and at least three of R's being alkenyl groups per one molecule,
a weight ratio ((A2)/(A1)) of (A2) to (A1) is 1 to 5, and
a weight ratio of the $SiO_{4/2}$ unit and the $R'SiO_{3/2}$ unit is 20 to 60% by weight based on the total amount of (A1) and (A2).

(A1) is a linear polyorganosiloxane represented by the formula (I), and is a component which becomes a base polymer with (A2).

In the formula (I), $R^1$ is a $C_2$-$C_6$ alkenyl group, and these may be a branched or a linear, and exemplified by a vinyl, allyl, 3-butenyl, 5-hexenyl, etc. Of these, a vinyl group is most preferred since synthesis is easy, and fluidity of the composition and heat resistance of the cured product are not impaired. $R^1$ exists in the formula (I) at least 2. At this time, $R^1$s may exist at any siloxane units in the molecule, but at least a part of $R^1$s preferably exists at the end of the molecule to obtain good reactivity, and $R^1$s are more preferably exist at the both ends of the molecule, i.e., total two $R^1$s.

In the formula (I), $R^2$ is a $C_1$-$C_6$ alkyl group. The $C_1$-$C_6$ alkyl group may be a branched or a linear, and may be exemplified by a methyl, ethyl, propyl, etc. Of these, a methyl group is most preferred since synthesis and handling thereof are easy, and a cured product excellent in thermal properties and mechanical properties is provided.

In the formula (I), n is a number which makes the viscosity at 23° C. 10 to 10,000 cP. If the viscosity is within the range, a cured product excellent in mechanical properties and a viscosity easily workable in combination with (A2) can be provided. The viscosity is preferably 20 to 5,000 cP, more preferably 50 to 2,500 cP, further preferably 150 to 2,500 cP, particularly preferably 1,100 to 2,500 cP. Incidentally, the viscosity is a value measured according to the rotational viscosity method regulated in JIS K6249, Item 7.1.

(A2) is a branched polyorganosiloxane, and is a component which becomes a base polymer with the above-mentioned (A1), and can provide an excellent mechanical strength particularly to the cured product.

(A2) comprises a $SiO_{4/2}$ unit and an $R'_3SiO_{1/2}$ unit, and further optionally an $R'_2SiO$ and/or an $R'SiO_{3/2}$ unit (wherein R's each independently represent an unsubstituted or substituted monovalent hydrocarbon group), and at least three R's are alkenyl groups per molecule so that it becomes a cross-linking point in the curing reaction. (A2) is preferably a solid or a viscous semi-solid resinous or liquid-state material at normal temperature.

A molar ratio (a molar number of the $R'_3SiO_{1/2}$ unit/a molar number of the $SiO_{4/2}$ unit) of the $R'_3SiO_{1/2}$ unit to the $SiO_{4/2}$ unit is preferably 0.25 to 1.5. When the molar ratio is within the range, excellent strength can be provided to the cured product which was cured, and the product shows excellent cold resistance. The molar ratio is preferably 0.4 to 1.2, more preferably 0.5 to 1.0.

When R' is an alkenyl group, a $C_2$-$C_6$ alkenyl group may be mentioned. These may be a branched or a linear, and a vinyl, allyl, 3-butenyl, 5-hexenyl, etc., may be exemplified. Since synthesis is easy, and flowability of the composition before curing and heat resistance of the composition after curing are not impaired, a vinyl group is most preferred.

The alkenyl group can exists as R' of the $R'_3SiO_{1/2}$ unit. The alkenyl group may optionally exist as R' of the $R'_2SiO$ unit or the $R'SiO_{3/2}$ unit, but to obtain rapid curing at room temperature, it is preferred that at least a part of the alkenyl groups exists at the $R'_3SiO_{1/2}$ unit.

As R' other than the alkenyl group, there may be mentioned an unsubstituted or substituted, monovalent aliphatic group or alicyclic group containing no aliphatic unsaturated carbon-carbon bond, and exemplified by an alkyl group such as methyl, ethyl, propyl, butyl, pentyl, hexyl, octyl, decyl, dodecyl; a cycloalkyl group such as cyclohexyl; and a monovalent aliphatic group or alicyclic group substituted by a halogen (for example, chloro or fluoro) or a cyano such as chloromethyl, 2-cyanoethyl, 3,3,3-trifluoropropyl. In consideration of heat resistance, a methyl group is preferred.

In the polyorganosiloxane composition of the present invention, a weight ratio of (A2) based on (A1) (a weight of (A2)/a weight of (A1)) is 1 to 5. If the weight ratio is within the range, hardness of the cured product is high, and change in modulus of elasticity at low temperature can be controlled. The weight ratio is preferably 1 to 4, more preferably 1.5 to 2.5.

In the polyorganosiloxane composition of the present invention, a weight ratio of the $SiO_{4/2}$ unit and the optionally existing $R'SiO_{3/2}$ unit based on the total amount of (A1) and (A2) is 20 to 60% by weight in total. If the weight ratio is within the range, excellent mechanical strength or low temperature characteristics are provided to the cured product. The weight ratio is preferably 25 to 50% by weight.

(B) Polyorganohydrogensiloxane

The polyorganosiloxane composition of the present invention contains (B) a polyorganohydrogensiloxane having hydrogen atoms bonded to a silicon atom in a number of exceeding 2 in the molecule. (B) acts as a cross-linking agent of (A) by subjecting to an addition reaction of the hydrosilyl group in the molecule with the alkenyl group in (A). Such (B) has hydrosilyl groups pertain to the addition reaction with a number of exceeding 2 in the molecule to cross-link the cured product, preferably 3 or more.

Component (B) is a component representatively having a unit represented by the formula (II):

$$(R^3)_c H_d SiO_{(4-c-d)/2} \quad (II)$$

(wherein
$R^3$ represents an unsubstituted or substituted, monovalent aliphatic group or alicyclic group which does not contain aliphatic unsaturated carbon-carbon bond;
c is an integer of 0 to 2;
d is 1 or 2, provided that c+d is an integer of 1 to 3),
with a number of exceeding 2 in the molecule, preferably 3 or more.

$R^3$ and an organic group bonded to the silicon atom of the other siloxane unit of (B) may be exemplified by the same groups as those of R' other than the alkenyl group in the above-mentioned (A2), and among of these, a methyl group is most preferred since synthesis is easy. Also, d is preferably 1 since synthesis is easy.

The siloxane skeleton of (B) may be either of a linear, a branched or a cyclic. Also, a mixture thereof may be used.

A polymerization degree of (B) is not particularly limited, but since it is difficult to synthesize polyorganohydrogensiloxane in which 2 or more hydrogen atoms are bonded to the same silicon atom, so that it preferably comprises 3 or more siloxane units. Since the material does not volatize even when it is heated at a curing temperature, and excellent in fluidity whereby easily mixed with (A), a number of the siloxane unit is further preferably 6 to 200, and particularly preferably 10 to 150.

As (B), a polyorganohydrogensiloxane represented by the formula (II'):

[Formula 3]

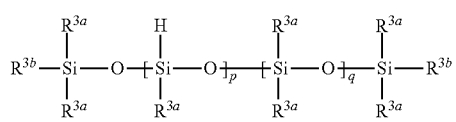

(wherein $R^{3a}$s independently represent an unsubstituted or substituted, monovalent aliphatic group or alicyclic group, which does not contain aliphatic unsaturated carbon-carbon bond, $R^{3b}$s independently represent a hydrogen atom, or an unsubstituted or substituted, monovalent aliphatic group or alicyclic group, p is a number of 2 to 100, preferably a number of 3 to 50, q is a number of 0 to 100, preferably a number of 3 to 50) can be preferably used.

The unsubstituted or substituted, monovalent aliphatic group or alicyclic group which does not contain aliphatic unsaturated carbon-carbon bond of $R^{3a}$ and $R^{3b}$ may be exemplified by an alkyl group such as methyl, ethyl, propyl, butyl, pentyl, hexyl, octyl, decyl and dodecyl; a cycloalkyl group such as cyclohexyl; a monovalent aliphatic group or alicyclic group substituted by a halogen (for example, chloro or fluoro) or cyano such as chloromethyl, 2-cyanoethyl and 3,3,3-trifluoropropyl. In consideration of heat resistance, a methyl group is preferred.

A formulation amount of (B) is preferably an amount where a ratio (H/Vi) of the hydrogen atom bonded to the silicon atom in (B) to the alkenyl group in (A) becomes 0.3 to 5.0 since a cured product having excellent mechanical properties can be obtained. If H/Vi is within the range, mechanical strength and heat resistance of the cured product are sufficient, and foaming at the time of curing can be suppressed. H/Vi is more preferably 0.5 to 5.0, and further preferably 0.7 to 2.0.

(C) Platinum Group Metal Compound

The polyorganosiloxane composition of the present invention contains (C) a platinum group metal compound. (C) acts as a catalyst to accelerate the addition reaction of the alkenyl group in (A) and the hydrosilyl group in (B). (C) may be used a platinum group metal atom compound such as platinum, rhodium and palladium, and may be exemplified by a platinum compound such as chloroplatinic acid, a reaction product of chloroplatinic acid and an alcohol, a platinum-olefin complex, a platinum-vinylsiloxane complex, a platinum-ketone complex and a platinum-phosphine complex; a rhodium compound such as a rhodium-phosphine complex and a rhodium-sulfide complex; and a palladium compound such as a palladium-phosphine complex.

Among these, a reaction product of chloroplatinic acid and an alcohol, and a platinum-vinylsiloxane complex are preferred since catalyst activity is good. When it is necessary to cure within a short period of time to show adhesiveness, a platinum-1,3-divinyl-1,1,3,3-tetramethyldisiloxane complex and platinum-1,3,5,7-tetravinyl-1,3,5,7-tetramethylcyclotetrasiloxane are preferred. However, the required curing rate may vary depending on a shape of the portion to be provided a cured product, or a working time necessary for manufacturing the same, so that it can be optionally selected in combination of (C) and the curing retardant.

A formulation amount of (C) is preferably an amount which becomes 0.1 to 1,000 ppm by weight in terms of a platinum group metal atom based on the total amount of (A) and (B) since an excellent curing rate can be obtained. It is more preferably 0.5 to 200 ppm by weight.

In the polyorganosiloxane composition of the present invention, an adhesiveness-imparting agent may be formulated within the range which does not inhibit the catalyst activity of (C), if necessary. The adhesiveness-imparting agent may be exemplified by 3-glycidoxypropyl group-containing alkoxysilanes such as 3-glycidoxypropyltrimethoxysilane, 3-glycidoxypropyltriethoxysilane and 3-glycidoxypropyl(methyl)dimethoxysilane; 2-(3,4-epoxycyclohexyl)ethyl group-containing alkoxysilanes such as 2-(3,4-epoxycyclohexyl)ethyltrimethoxysilane, 2-(3,4-epoxycyclohexyl)ethyltriethoxysilane and 2-(3,4-epoxycyclohexyl)ethyl(methyl)dimethoxysilane; alkenylalkoxysilanes such as vinyl-trimethoxysilane, vinyl-triethoxysilane, vinyltris(2-methoxyethoxy)silane, methylvinyldimethoxysilane, allyltrimethoxysilane, allyltriethoxysilane and methylallyldimethoxysilane; (meth)acryloxypropylalkoxysilanes such as 3-acryloxypropyltrimethoxysilane, 3-acryloxypropyltriethoxysilane, 3-acryloxypropyl(methyl)dimethoxysilane, 3-methacryloxypropyltrimethoxysilane, 3-methacryloxypropyltriethoxysilane and 3-methacryloxypropyl(methyl)dimethoxysilane; an organosilane compound having a hydrogen atom bonded to a silicon atom, and a side chain represented by the following formula (III):

[Formula 4]

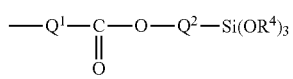

(wherein $Q^1$ represents a linear or branched alkylene group which forms a carbon chain having 2 or more carbon atoms between a silicon atom and the ester bond; $Q^2$ represents a linear or branched alkylene group which forms a carbon chain having 3 or more carbon atoms between the oxygen atom and a silicon atom at the side chain; and $R^4$ represents an unsubstituted or substituted alkyl group having 1 to 6 carbon atoms) which is bonded to a silicon atom; aluminum alkoxides such as aluminum triethoxide, aluminum tripropoxide, aluminum tributoxide, etc.; titanium alkoxides such as titanium tetraethoxide, titanium tetrapropoxide, titanium tetraisopropoxide, titanium tetrabutoxide, titanium tetraisobutoxide, titanium tetraisopropenyloxide, etc.; zirconium alkoxides such as zirconium tetraisopropoxide, zirconium tetrabutoxide; polar group-containing organic compounds such as diallyl maleate, triallylisocyanate, etc.

In the side chain represented by the above-mentioned formula (III), $Q^1$ may be exemplified by an alkylene group such as ethylene, trimethylene, 2-methylethylene, tetramethylene, etc., and preferably an ethylene group and 2-methylethylene group since they are easy in synthesis and handling. $Q^2$ may be exemplified by an alkylene group such as trimethylene, 2-methyltrimethylene, tetramethylene, etc., and preferably trimethylene group since it is easy in synthesis and handling. $R^4$ may be exemplified by an alkyl group such as methyl, ethyl, propyl, isopropyl, butyl, etc.; and an alkyl group substituted by an alkoxy such as 2-methoxyethyl, etc. Methyl group and an ethyl group are preferred, and particularly preferably a methyl group since the product has good adhesiveness, and an alcohol generated by hydrolysis is easily volatilized. The organosilane compound having such a side chain may be exemplified by the cyclic siloxane compound represented by the formula (IV):

[Formula 5]

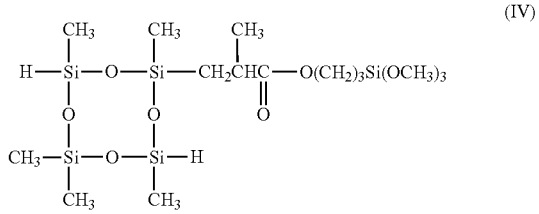

(IV)

A formulation amount of the adhesiveness-imparting agent can be 0.01 to 20 parts by weight based on 100 parts by weight of (A), preferably 0.1 to 10 parts by weight particularly in the viewpoint of adhesiveness, and further preferably 0.5 to 5 parts by weight.

A curing controller agent may be formulated to improve preservability or workability of the polyorganosiloxane composition of the present invention. The above-mentioned diallyl maleate is effective not only as an adhesiveness-imparting agent, but also as a curing controller. In addition, the curing controller may be exemplified by acetylene alcohols such as 3-methyl-1-butyn-3-ol, 3-methyl-1-pentyn-3-ol, 3,5-dimethyl-1-hexyn-3-ol and 1-ethynyl-1-cyclohexan-1-ol. A formulation amount of the curing controller can be selected an optional amount depending on the desired curability.

An inorganic filler may be added to the polyorganosiloxane composition of the present invention for the purpose of providing suitable flowability at the time of before curing, and providing high mechanical strength to the cured product, which are required depending on the uses. The inorganic filler may be exemplified by dry process silica such as fumed silica and arc silica; and wet process silica such as precipitated silica. These materials may be used as such, or may be used after subjecting to surface treatment with a hydrophobidizing agent such as hexamethyldisilazane. Also, there may be exemplified by diatomaceous earth, crushed quartz, fused quartz, titanium oxide, aluminum oxide, zinc oxide, aluminosilicate, calcium carbonate, organic acid-surface treated calcium carbonate, magnesium carbonate, zinc carbonate, calcium silicate, talc, ferric oxide, etc., and they are selected depending on extrusion workability and required physical properties of the cured product. Also, depending on the purposes, conductive filler such as carbon black may be formulated.

A formulation amount of the inorganic filler can be 0 to 500 parts by weight based on 100 parts by weight of (A), and in particular, 0 to 200 parts by weight is preferred in the points of durability or mechanical strength of the cured product, and workability (viscosity).

Further, to the polyorganosiloxane composition of the present invention may be added various kinds of additives depending on the purposes, such as a pigment, a thixotropy-imparting agent, a viscosity modifier to improve extrusion workability, UV absorber, mildewproofing agent, heat resistance improver, flame retardant, etc. Also, in some cases, it may be in a form of dissolving or dispersing in an organic solvent such as toluene and xylene.

The polyorganosiloxane composition of the present invention can be prepared by uniformly mixing and kneading (A) to (C), and other component(s) further formulated depending on necessity, by a mixing means such as an universal mixing and kneading machine, a kneader, etc. Also, to preserve the composition for a long period of time, (B) and (C) are so prepared that they are contained in separate provisional formulations, optionally by preparing two provisional formulations and storing the same, and immediately before using, they may be uniformly mixed by a mixing means such as a mixing head of a quantitative mixer to prepare a silicone rubber composition, and defoamed under reduced pressure to be applied for practical use.

The polyorganosiloxane composition of the present invention can give a cured product which is a rubbery elastomer by curing under heating. A forming method of the cured product is not particularly limited, and, for example, the polyorganosiloxane composition of the present invention may be poured into a suitable mold, and then, cured under heating to form a cured product. Otherwise, the polyorganosiloxane composition of the present invention may be coated on a suitable substrate, and cured under heating to form a cured product. The conditions for curing under heating may be optionally selected, and the heating temperature can be optionally set, for example, between 50 to 250° C. The heating time may be set to, for example, 1 minute to 24 hours.

The cured product of the polyorganosiloxane composition of the present invention is excellent in cold resistance, and a ratio (shear modulus −60° C./shear modulus 23° C.) of the modulus of elasticity at −60° C. to the modulus of elasticity at 23° C. can be made 0.5 to 9.0. The above-mentioned ratio of the shear modulus is preferably 4.0 or less. Here, the shear modulus is a value measured by a viscoelasticity measurement device ARES (manufactured by TA Instruments).

A silicone rubber product comprising a cured product of the polyorganosiloxane composition of the present invention is excellent in cold resistance, and heat resistance, cold resistance, weather resistance and electric insulation inherently possessed by the silicone rubber can be also expected so that it is highly useful. In particular, it can be suitably used as an adhesive and a sealing agent of parts of an automobile, a vehicle, a ship, an airplane, etc., or parts of a semiconductor device.

EXAMPLES

In the following, the present invention will be explained in more detail by referring to Examples and Comparative examples. In these examples, all parts mean parts by weight otherwise specifically mentioned, and the viscosity means a viscosity measured by a Brookfield type rotational viscometer at 23° C. according to JIS K6249. The present invention is not limited by these Examples.

The following mentioned polysiloxanes were used in Examples and Comparative examples. In the following, siloxane units are shown by the following symbols.

M unit: $(CH_3)_3SiO_{1/2}$—
$M^V$ unit: $(CH_3)_2(CH_2\!=\!CH)SiO_{1/2}$—
D unit: —$(CH_3)_2SiO$—
$D^H$ unit: —$(CH_3)HSiO$—
$D^V$ unit: —$(CH_3)(CH_2\!=\!CH)SiO$—
Q unit: $SiO_{4/2}$ (tetra-functional)
A1-1: A linear polymethylvinylsiloxane in which the both ends of which are sealed by $M^V$ unit, the intermediate unit being D unit, and having a viscosity at 23° C. of 1500 cP;
A1-2: A linear polymethylvinylsiloxane in which the both ends of which are sealed by M$^V$ unit, the intermediate unit being D unit, and having a viscosity at 23° C. of 250 cP;

A1-3: A linear polymethylvinylsiloxane in which the both ends of which are sealed by M$^V$ unit, the intermediate unit being D unit, and having a viscosity at 23° C. of 60 cP;

A1-4: A linear polymethylvinylsiloxane in which the both ends of which are sealed by M$^V$ unit, the intermediate unit being D unit, and having a viscosity at 23° C. of 10,000 cP;

A2-1: A branched polymethylvinylsiloxane being M unit, M$^V$ unit and Q unit, and represented by the unit formula $M_5M^V Q_8$;

A2-2: A branched polymethylvinylsiloxane being M unit, D$^V$ unit and Q unit, and represented by the unit formula $M_6D^V Q_8$;

B: A linear polymethylhydrogensiloxane in which the both ends of which are sealed by M unit, the intermediate unit being 50 mol % of D$^H$ unit and the remaining D unit, and represented by $MD^H{}_{20}D_{20}M$.

The following mentioned platinum-vinylsiloxane complex was used as a catalyst in Examples and Comparative examples.

C: A complex obtained by heating chloroplatinic acid with cyclic siloxane represented by $D^V{}_4$, and a platinum content of which is 2% by weight.

The following mentioned curing controller was used in Examples and Comparative examples.

D: SURFYNOL 61 (3,5-dimethyl-1-hexyn-3-ol (available from Air Products and Chemicals Inc. Japan))

The following mentioned organosilane compounds were used as an adhesiveness-imparting agent in Examples and Comparative examples.

E-1: Mixture of cyclic siloxane isomers represented by the formula:

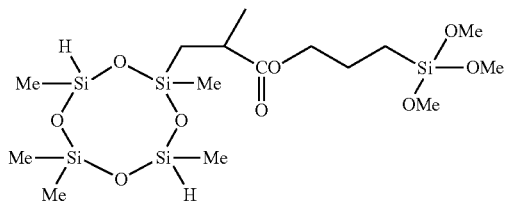

[Formula 6]

E-2:

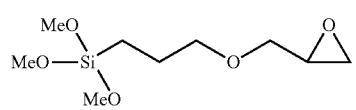

[Formula 7]

The following mentioned inorganic fillers were used in Examples and Comparative examples.

F-1: Crushed quartz having an average grain size of 4 μm (CRYSTALITE VX-S, available from Tatsumori Ltd. The average grain size is a 50% weight average when the grain size distribution by the laser method)

F-2: Surface-treated fumed silica in which fumed silica having a BET specific surface area of 300 m$^2$/g was surface treated with hexamethyldisilazane Examples 1 to 6, Comparative Examples 1 to 3

According to the following mentioned method, polyorganosiloxane compositions were prepared by using the starting materials shown in Table 1.

In an apparatus equipped with a stirrer, a heating device and a pressure-reducing device were charged A1 and 50% by weight of a toluene solution of A2 which had previously been adjusted the concentration, and after uniformly mixing, toluene was distilled off at 150° C. and 13 kPa {1 torr} to prepare a polysiloxane solution. This was transferred into an universal mixing and kneading machine, F was added thereto, and the mixture was kneaded at 100° C. for 3 hours under reduced pressure, then, cooled at 40° C. or lower, and C and D were mixed therewith. Next, B and E were added and kneaded for 10 minutes under reduced pressure, and defoaming was carried out to prepare a polyorganosiloxane composition.

TABLE 1

| | | Example 1 | Example 2 | Example 3 | Example 4 | Example 5 | Example 6 | Comparative example 1 | Comparative example 2 | Comparative example 3 |
|---|---|---|---|---|---|---|---|---|---|---|
| A1 | A1-1 | 33 | — | — | 33 | | | 65 | 85 | — |
| | A1-2 | — | 30 | 30 | | | | — | — | 100 |
| | A1-3 | | | | | 25 | | | | |
| | A1-4 | | | | | | 50 | | | |
| A2 | A2-1 | 67 | 70 | 70 | 67 | 75 | | 35 | 15 | 0 |
| | A2-2 | | | | | | 50 | | | |
| B | | 10.2 | 10 | 13 | 10.2 | 11.8 | 8.2 | 7 | 4 | 3 |
| C ppm (in terms of Pt) | | 10 | 10 | 10 | 10 | 10 | 10 | 10 | 10 | 10 |
| D | | 0.5 | 0.5 | 0.5 | 0.5 | 0.5 | 0.5 | 0.5 | 0.5 | 0.5 |
| E | E1 | 1 | 1 | 1 | 1 | 1 | 2.5 | 1 | 1 | 1 |
| | E2 | 0.5 | 0.5 | 0.5 | 0.5 | 0.5 | 1 | 0.5 | 0.5 | 0.5 |
| F | F1 | 100 | 100 | 0 | 100 | 0 | 25 | 0 | 0 | 100 |
| | F2 | 0 | 0 | 10 | 10 | 10 | 10 | 10 | 10 | 0 |

TABLE 1-continued

|  | Example 1 | Example 2 | Example 3 | Example 4 | Example 5 | Example 6 | Comparative example 1 | Comparative example 2 | Comparative example 3 |
|---|---|---|---|---|---|---|---|---|---|
| A2/A1 (Weight ratio) | 2.0 | 2.3 | 2.3 | 2.0 | 3.0 | 1.0 | 0.54 | 0.18 | 0.00 |
| Ratio of T and Q (% by weight) based on the total amount of A1 and A2 | 32.8 | 34.3 | 34.3 | 32.8 | 36.8 | 23.0 | 17.2 | 7.4 | 0.0 |
| H/Vi* | 1.0 | 0.9 | 1.2 | 1.0 | 1.0 | 1.2 | 1.2 | 1.2 | 1.1 |
| Shear modulus (23° C., Pa) | 6.00E+07 | 6.00E+07 | 6.70E+07 | 1.00E+08 | 7.50E+07 | 1.90E+07 | 5.00E+06 | 1.00E+06 | 4.00E+06 |
| Shear modulus (−60° C., Pa) | 1.60E+08 | 2.30E+08 | 2.00E+08 | 2.00E+08 | 2.10E+08 | 7.00E+07 | 5.00E+07 | 7.00E+07 | 2.00E+08 |
| Modulus of elasticity (−60° C.)/Modulus of elasticity (23° C.) | 2.7 | 3.8 | 3.0 | 2.0 | 2.8 | 3.7 | 10 | 70 | 50 |
| Hardness Type D/Type A | 52/97 | 50/95 | —/92 | 54/98 | 47/93 | —/80 | —/75 | —/15 | —/60 |

*A ratio of hydrogen atoms bonded to silicon atom in B based on the alkenyl group of A1 and A2

Evaluation Methods and Results

With regard to the compositions of Examples and Comparative examples, modulus of elasticity and hardness were measured as follows. Evaluation results are shown in Table 1.

Shear Modulus

By using a viscoelasticity measurement device ARES (manufactured by TA Instruments), the compositions of Examples and Comparative examples were cured in a parallel plate at 150° C. for 1 hour so that they became a thickness of 1 mm.
Thereafter, shear modulus was continuously measured with the measured frequency of 1 Hz and measured strain of 0.5% at −100° C. to 100° C., and the temperature raising rate of 10° C./min. More specifically, one edge of the plate was twisted and the stress to the opposite side was measured.

Hardness

Each composition of Examples and Comparative examples was poured into a mold made of aluminum which had been Teflon (Registered Trademark)-coated and a size of a length of 60 mm×a width of 30 mm×a depth of 6 mm, cured at 150° C. for 1 hour, and after cooling to 23° C., then, measurements were carried out according to JIS K6249 with regard to Type A, and according to JIS K6253 with regard to Type D.

The cured products of the compositions of the respective Examples had a small ratio of the shear modulus at −60° C. to the shear modulus at 23° C. of 4.0 or less, Type D and Type A hardnesses are in the good ranges.

UTILIZABILITY IN INDUSTRY

Silicone rubber products comprising the cured product of the polyorganosiloxane composition according to the present invention are excellent in cold resistance, and heat resistance, cold resistance, weather resistance and electric insulation inherently possessed by the silicone rubber can be also expected so that they are industrially extremely useful.

The invention claimed is:
1. A method of preparing a curable polyorganosiloxane composition, the method comprising:
(a) kneading a uniform mixture of an alkenyl group-containing polyorganosiloxane, a polyorganohydrogensiloxane, and a platinum group metal compound, and
(b) defoaming the resultant kneaded mixture from step (a) under reduced pressure, wherein

(A) the alkenyl group-containing polyorganosiloxane comprises
(i) a linear polyorganosiloxane represented by a formula (I) as follows:

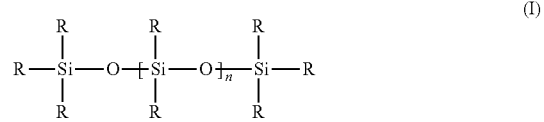

(I)

wherein each R group is independently a R1 group or a R2 group, and at least two R groups are R1 groups; each R1 group is independently a C2-C6 a\keny\ group; each R2 group is independently a C1-C6 alkyl group; and n is a value that yields a viscosity at 23° C. of 50 to 2,500 cPs, and
(ii) a branched polyorganosiloxane comprising a $SiO_{4/2}$ unit and a $R'_3SiO_{1/2}$ unit, and optionally a $R'_2SiO$ unit and/or a $R'SiO_{3/2}$ unit, wherein each R' group independently represents an unsubstituted or substituted, monovalent aliphatic group or alicyclic group, and at least three R' groups per molecule are alkenyl groups,
the alkenyl group-containing polyorganosiloxane having a weight ratio of the branched polyorganosiloxane to the linear polyorganosiloxane of 2.0 to 3.0, and, when the optional $R'SiO_{3/2}$ unit is present in the branched polyorganosiloxane, a weight ratio of the $SiO_{4/2}$ unit and the $R'SiO_{3/2}$ unit is 25 to 50% by weight based on the total weight of the linear polyorganosiloxane and the branched polyorganosiloxane; and
(B) a number of hydrogen atoms bonded to a silicon atom of the polyorganohydrogensiloxane exceeds 2.
2. The method according to claim 1, wherein the $R^1$ group is a vinyl group and the alkenyl R' groups are vinyl groups.
3. The method according to claim 1, wherein the polyorganohydrogensiloxane is represented by a formula (II') as follows:

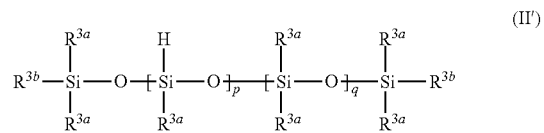

(II')

wherein each $R^{3a}$ group independently represents an unsubstituted or substituted, monovalent aliphatic group or alicyclic group containing no aliphatic unsaturated carbon-carbon bond; each $R^{3b}$ group independently represents a hydrogen atom or an unsubstituted or substituted, monovalent aliphatic group or alicyclic group, p has a value from 2 to 100, and q has a value from 0 to 100.

4. The method according to claim 1, wherein the platinum group metal compound is a platinum-vinylsiloxane complex.

5. The method according to claim 1, further comprising: adding an inorganic filler to the uniform mixture.

6. The method according to claim 1, further comprising: adding 3,5-dimethyl-1-hexyn-3-ol to the uniform mixture.

7. The method according to claim 2, wherein the polyorganohydrogensiloxane is represented by a formula (II') as follows:

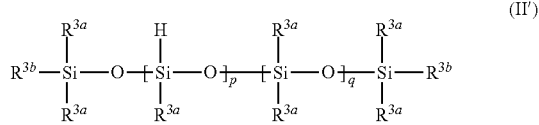

wherein each $R^{3a}$ group independently represents an unsubstituted or substituted, monovalent aliphatic group or alicyclic group containing no aliphatic unsaturated carbon-carbon bond; each $R^{3b}$ group independently represents a hydrogen atom or an unsubstituted or substituted, monovalent aliphatic group or alicyclic group, p has a value from 2 to 100, and q has a value from 0 to 100.

8. An adhesive comprising the curable polyorganosiloxane composition prepared by the method according to claim 1 and an adhesiveness imparting agent.

9. A semiconductor device which is encapsulated by the curable polyorganosiloxane composition prepared by the method according to claim 1.

10. A method of producing a cured polyorganosiloxane product from the curable polyorganosiloxane composition according to claim 1, the method comprising:
coating the polyorganosiloxane composition on a suitable substrate, and
curing the resultant polyorganosiloxane composition coating to form a cured product.

11. The method according to claim 10, wherein the polyorganosiloxane composition coating is cured by heating the polyorganosiloxane composition coating at a temperature between 50 to 250° C. for 1 minute to 24 hours.

* * * * *